(12) United States Patent
Kim et al.

(10) Patent No.: US 6,391,803 B1
(45) Date of Patent: May 21, 2002

(54) METHOD OF FORMING SILICON CONTAINING THIN FILMS BY ATOMIC LAYER DEPOSITION UTILIZING TRISDIMETHYLAMINOSILANE

(75) Inventors: Yeong-Kwan Kim; Young-Wook Park, both of Suwon; Seung-Hwan Lee, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/886,142

(22) Filed: Jun. 20, 2001

(51) Int. Cl.[7] .............................................. H01L 21/31
(52) U.S. Cl. ...................... 438/787; 438/790; 438/791; 438/794; 427/255.393; 427/255.394
(58) Field of Search ................................ 438/787, 788, 438/789, 790, 791, 792, 793, 794; 427/99, 255.18, 255.37, 255.393, 255.394

(56) References Cited

U.S. PATENT DOCUMENTS

| 6,090,442 A | 7/2000 | Klaus et al. ............ 427/255.15 |
| 6,194,310 B1 * | 2/2001 | Hsu et al. .................... 438/643 |
| 6,197,683 B1 * | 3/2001 | Kang et al. .................. 438/643 |
| 6,200,893 B1 * | 3/2001 | Sneh ............................ 438/685 |
| 6,284,646 B1 * | 9/2001 | Leem ........................... 438/629 |

OTHER PUBLICATIONS

Yokoyama, et al. Atomic Layer Controlled Deposition of Silicon Nitride and in Situ Growth Observation by Infrared Reflection Absorption Spectroscopy. Applied Surface Science 112 (1997) 75–81 No month.

Goto, et al. Atomic Layer Controlled Deposition of Silicon Nitride with Self–Limiting Mechanism Appl. Phys. Lett (Jun. 1996) 3257–3259.

Klaus, et al. Atomic Layer Controlled Growth of $Si_3N_4$ Films Using Sequential Surface Reactions Surface Science 418 (1998) 14–19 No Month.

Yamaguchi, et al. Atomic–Layer Chemical–Vapor–Deposition of Silicon Dioxide Films With an Extremely Low Hydrogen Content Appl. Surface Science (1998) 202–207 No Month.

Morishita, et al. New Substances for Atomic–Layer Deposition of Silicon Dioxide Journal of Non–Crystalline Solids (1995) 66–69 No Month.

Klaus, et al. Atomic Layer Controlled Growth of $SiO_2$ Films Using Binary Reaction Sequence Chemistry Appl. Phys. Lett 70. (1997) 1092–1094 No Month.

Morishita, et al. Atomic–Layer Chemical–Vapor–Deposition of Silicon–Nitride Appl. Surface Science (1997) 198–204 No Month.

* cited by examiner

Primary Examiner—Alexander G. Ghyka
(74) Attorney, Agent, or Firm—Marger, Johnson & McCollom, P.C.

(57) ABSTRACT

An atomic layer deposition method of forming a solid thin film layer containing silicon. A substrate is loaded into a chamber. A first portion of a first reactant is chemisorbed onto the substrate, and a second portion of the first reactant is physisorbed onto the substrate. The physisorbed portion is purged from the substrate and the chamber. A second reactant is injected into the chamber. A first portion is chemically reacted with the chemisorbed first reactant to form a silicon-containing solid on the substrate. The first reactant is preferably $Si[N(CH_3)_2]_4$, $SiH[N(CH_3)_2]_3$, $SiH_2[N(CH_3)_2]_2$ or $SiH_3[N(CH_3)_2]$. The second reactant is preferably activated $NH_3$.

28 Claims, 8 Drawing Sheets

METHOD OF FORMING SILICON CONTAINING THIN FILMS BY ATOMIC LAYER DEPOSITION UTILIZING TRISDIMETHYLAMINOSILANE

The present invention relates to a method of forming $Si_3N_4$ and $SiO_2$ thin film by utilizing atomic layer deposition method and employing trisdimethylaminosilane {HSi[N(CH$_3$)$_2$]$_3$}, (hereinafter, referred to as "TDMAS") as a reactant.

BACKGROUND OF THE INVENTION

Generally, $Si_3N_4$ and $SiO_2$ thin films are formed in semiconductor devices by utilizing deposition methods such as Chemical Vapor Deposition (CVD), Low Pressure Chemical Vapor Deposition (LPCVD), plasma-enhanced chemical vapor deposition (PECVD).

CVD-based methods often have drawbacks that limit their usefulness in the manufacture of semiconductor devices that would benefit by inclusion of thin films of $Si_3N_4$. In a typical CVD method, a thin film of $Si_3N_4$ is deposited at a relatively high temperature, which in general is less preferable than a lower temperature process due to the possibility of adverse thermal effects on the device. A $Si_3N_4$ layer deposited by CVD is also subject to geometric hindrances causing thickness variations across the surface of the device. The thickness of the thin film formed around densely packed features on the surface can be less than the thickness of the film around less densely packed features. This problem is known as a pattern loading effect.

LPCVD suffers from shortcomings as well. The hydrogen content of the LPCVD-manufactured thin film is usually high, and step coverage of the surface is not good. Since the film growth rate is relatively slow when using LPCVD, the processing time required to grow a film of suitable thickness is relatively long. The long processing time exposes the substrate to a relatively high temperature for a long time, and results in a high thermal budget associated with the LPCVD process.

Atomic layer deposition (ALD) has been proposed as an alternative to CVD-based depositions methods for the formation of $Si_3N_4$ and $SiO_2$ thin films. ALD is a surface controlled process conducted in a surface kinetic regime, and which results in two-dimensional layer-by-layer deposition on the surface. Goto et al. describe an ALD deposition method using dichlorosilane (DCS) and NH3 plasma to form a $Si_3N_4$ film. (Appl. Surf. Sci., 112, 75–81 (1997); Appl. Phys. Lett. 68(23), 3257–9(1996)). However, the properties of the thin film manufactured by the method described in Goto are not suitable. The Cl content (0.5%), and O content are unacceptably high. These, combined with a measured Si:N ratio of 41:37 indicate that this method does not form a near-stoichiometric film of $Si_3N_4$. In addition, the growth rate of 0.91 angstroms per cycle of 300 seconds is not as high as would be necessary for commercial applications.

Klaus et al. describe an ALD method of forming a $Si_3N_4$ film by reacting $SiCl_4$ and $NH_3$. See, U.S. Pat. No. 6,090,442, and Surf. Sci., 418, L14–L19 (1998). The characteristics of the thin film manufactured by this method are better than that achieved by Goto et al. The ratio of Si:N=1:1.39, and the Cl, H and O contents are acceptably low. However, the cycle time of 10 minutes to grow a 2.45-angstrom film is too long, making any commercial application impractical.

It has also been proposed to use $Si_2Cl_6$ (HCD) and N2H4 to deposit a thin $Si_3N_4$ film by ALD. (Appl. Surf. Sci., 112, 198–203 (1997)). While the stoichiometry, Cl and H content of such films are suitable, they exhibit an unacceptably high oxygen content, rendering such films unsuitable for the uses described above.

ALD has also been proposed as a method of depositing $SiO_2$ thin films. For example, it has been proposed to depositing process using $SiCl_4$ and $H_2O$. Appl. Phys. Lett. 70(9), 1092 (1997). However, the cycle time in the proposed process is too long for commercial application. U.S. Pat. No. 6,090,442 discloses a catalyzed process wherein a $SiO_2$ film is deposited using $SiCl_4$ and $H_2O$, with $C_5H_5N$ or $NH_3$ as a catalyst. The quality of the $SiO_2$ film obtained with this process is not good because of the low deposition temperatures. A process utilizing $Si(NCO)_4$ & TEA has been proposed (Appl. Surf. Sci. Vol. 130–132, pp. 202–207 (1998)), but also suffers from low quality due to low processing temperatures. The same is true of a proposed process using $Si(NCO)_x$, and $H_2O$, (J. Non-crystalline Solids, Vol. 187, 66–69(1995)).

Therefore, despite a long-recognized potential for widespread application, a need remains for a novel method of forming $Si_3N_4$ and $SiO_2$ thin films that meet the following criteria: low thermal budget process; excellent step coverage; no pattern loading effect; Si:N ratio consistent with $Si_3N_4$; excellent thickness control and uniformity; minimal number of particulate inclusions; low impurity content; and a film growth rate that makes commercial application practical.

In order to accomplish the above-described items, an atomic layer deposition (ALD) employing TDMAS as a reactant is utilized for the preparation of Si3N4 and SiO2 thin films in the present invention.

SUMMARY OF THE INVENTION

The present invention is embodied in an atomic layer deposition method of forming a solid thin film layer containing silicon in which a substrate is loaded into a chamber. A first reactant containing Si and an aminosilane is injected into the chamber, where a first portion of the first reactant is chemisorbed onto the substrate, and a second portion of the first reactant is physisorbed onto the substrate. The physisorbed second portion of the first reactant is then removed from the substrate, by purging and flushing the chamber in one preferred embodiment. A second reactant is then injected into the chamber, where a first portion of the second reactant is chemically reacted with the chemisorbed first portion of the first reactant to form a silicon-containing solid on the substrate. The non-chemically reacted portion of the second reactant is then removed from the chamber. In one preferred embodiment, the silicon-containing solid formed on the substrate is a thin film layer, a silicon nitride layer for example. In other preferred embodiments, the first reactant is at least one selected from the group consisting of Si[N(CH$_3$)$_2$]$_4$, SiH[N(CH$_3$)$_2$]$_3$, SiH$_2$[N(CH$_3$)$_2$]$_2$ and SiH$_3$[N(CH$_3$)$_2$]. The second reactant is preferably activated NH$_3$. The chamber pressure is preferably maintained in a range of 0.01–100 torr. and in preferred embodiments can be maintained constant throughout the process, or can be varied in at least one of the four steps. One or more of the foregoing steps can be repeated to achieve a thicker solid on the substrate.

In various embodiments, silicon-containing solids formed by the methods of the invention have a dry etch selectivity with respect to Si of a semiconductor device when formed as an active mask nitride, with respect to WSix and doped poly-Si of a semiconductor device when formed as a gate mask nitride, and with respect to W and Ti/TiN of a semiconductor device when formed as a bit line mask nitride. The silicon-containing solid formed on the substrate can also be formed to act as a CMP stopper, or as an insulating layer having a dry etch selectivity with respect to $SiO_2$ of a semiconductor device (spacer). In other embodiments, the silicon-containing solid formed on the substrate is an insulating layer having an HF wet etch selectivity with respect to $SiO_2$ of a semiconductor device to act as a wet stopper.

The silicon-containing solid formed on the substrate can serve as a gate dielectric of a semiconductor device, a layer formed between a $Ta_2O_5$ layer and a capacitor storage node of a semiconductor device, as a dielectric layer of a capacitor of a semiconductor device, or as an STI liner of a semiconductor device.

In other embodiments, the silicon-containing solid formed on the substrate is silicon oxide, and in one or more of those embodiments the second reactant is selected from the group consisting of H2O, H2O2, O2 plasma and O3 plasma.

In yet another embodiment, at least one of the first and second silicon-containing solids is a metal silicate wherein the metal is selected from the group consisting of Al, Hf, Zr, Ti, and Ta.

These and other features of the invention will now be described with reference to the drawings.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

The following description of preferred embodiments will begin with an explanation of the process steps of the methods, followed by descriptions of specific examples of preferred embodiments of the invention.

Referring now to FIGS. 1–6, a substrate 1 such as silicon (100) is placed in a chamber 3 (see FIG. 6), which is then evacuated to a pressure of about 2 Torr. Substrate 1 is heated to about 550° C. A stream 2 of 500 sccm of TDMAS in an Ar carrier gas is then introduced into the chamber for 15 seconds. The flow of stream 2 is then stopped, and the chamber is left undisturbed for between 15 and 165 seconds.

Figure 1:
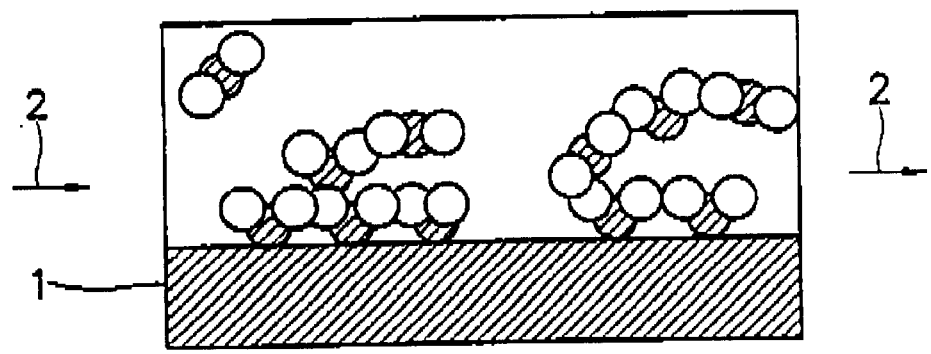
FIGS. 1, 2, 3, 4, and 5 describe the steps of processes for forming a thin film of Si3N4 using an atomic layer deposition according to a preferred embodiment of the present invention.
Figure 2:
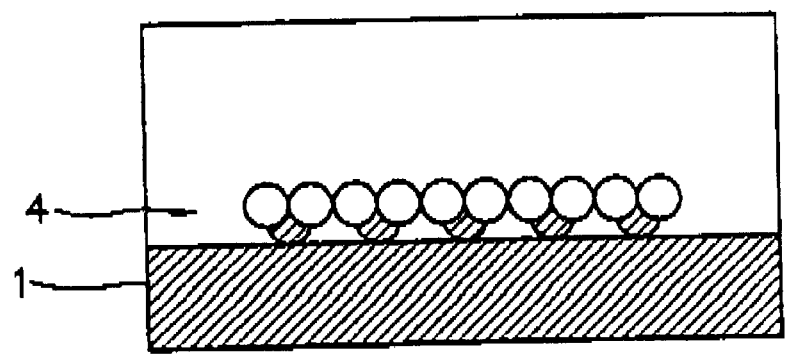
Figure 3:
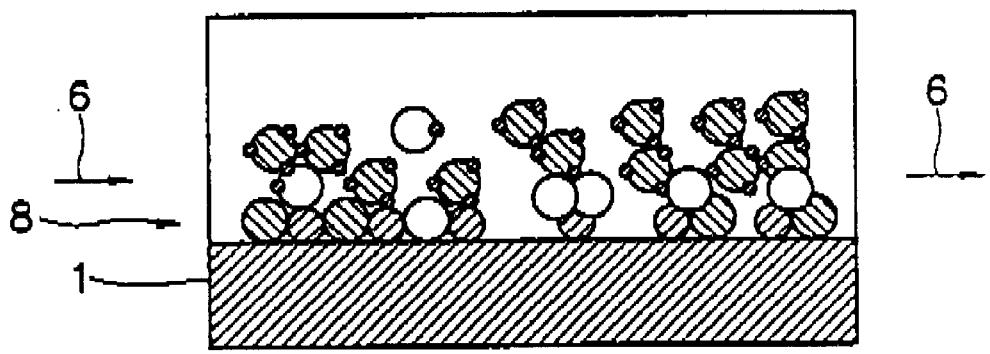
Figure 4:
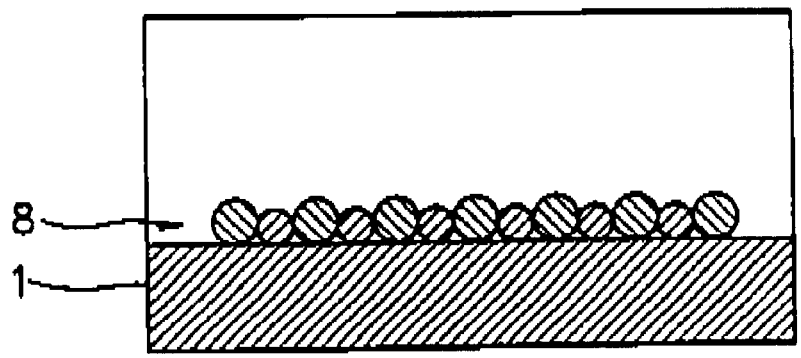
Figure 5:
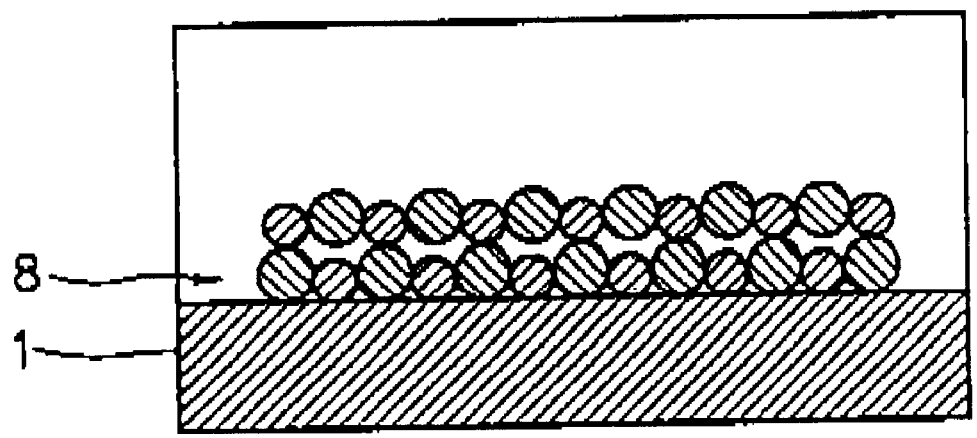

During this time, a first portion of the TDMAS chemisorbs and forms a layer 4 on the surface of substrate 1. A second portion of the TDMAS molecules physically attaches (physisorbs) onto, and is loosely held to the chemisorbed layer of TDMAS. The chamber 3 is then purged with $N_2$ for 5 seconds, and vacuum purged for 5 seconds. During these purging steps, the non-chemically absorbed portions of TDMAS are removed from the chamber, leaving the chemisorbed layer 4 of TDMAS intact on the substrate 1 (FIG. 2). Referring now to FIG. 3, a stream 6 of 2000 sccm of Ar containing activated $NH_3$ is then introduced into chamber 3 for 30 seconds, while maintaining a reduced chamber pressure of 0.5 Torr and a substrate temperature of 550° C. A portion of the activated $NH_3$ reacts with the chemisorbed TDMAS on the substrate to form a layer 8 of $Si_3N_4$ (FIG. 4). In one embodiment, the activated $NH_3$ is a plasma is generated in a plasma generator that is operated at about 400 watts, but the power can be varied and the invention is not intended to be limited to a particular plasma chamber power level. After the $NH_3$-containing stream has flowed into the chamber for 30 seconds, chamber 3 is then purged with $N_2$ for 5 seconds, and then vacuum purged for 5 seconds. The steps of introducing TDMAS into chamber 3, purging, introducing $NH_3$ into the chamber, and purging again can be repeated to achieve any desired thickness of $Si_3N_4$ layer 8. The formation of the $Si_3N_4$ layer 8 is now complete.

Figure 6:
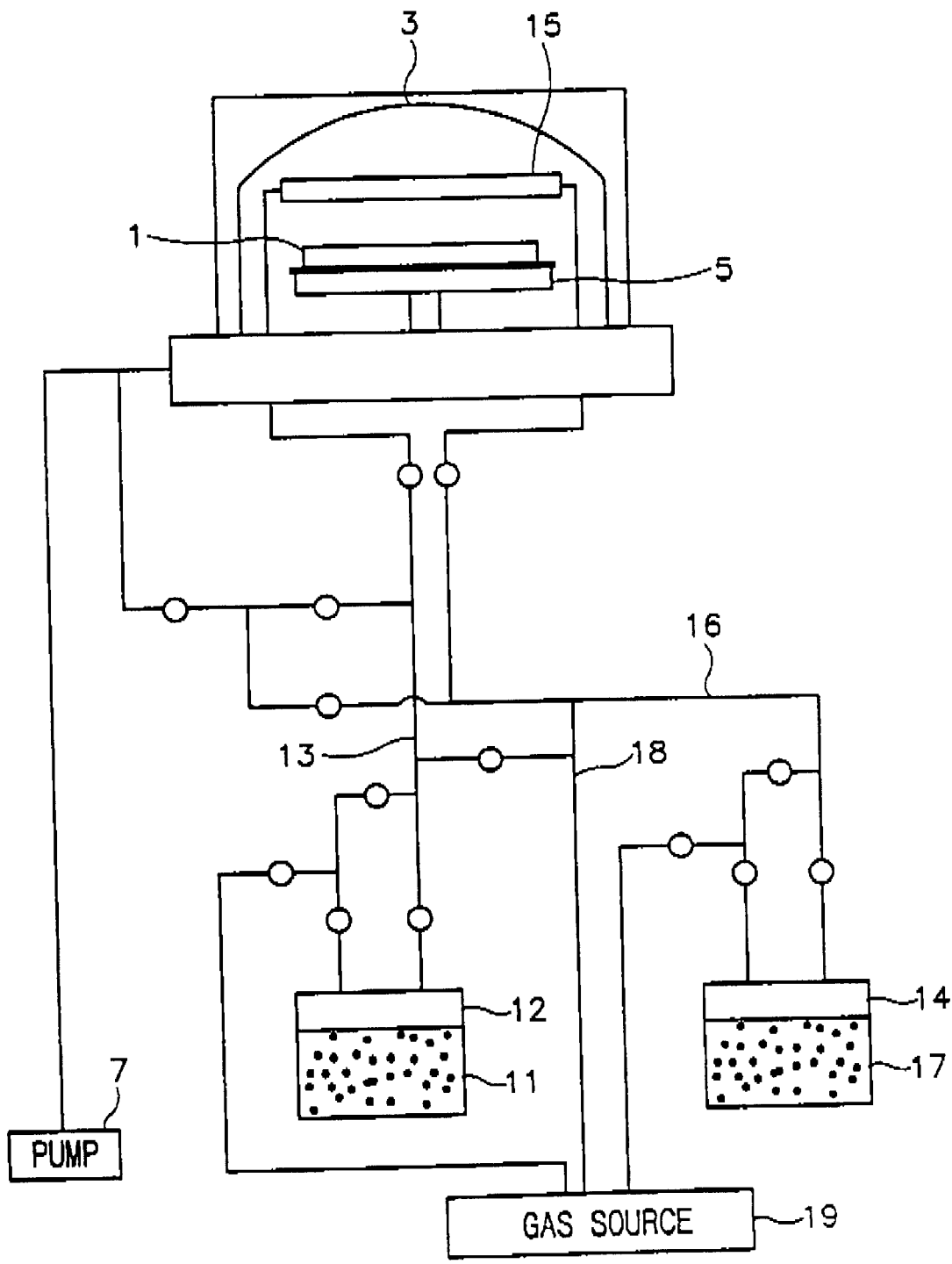
FIG. 6 is a schematic diagram of a thin film manufacturing apparatus used for a thin film manufacturing method according to the present invention.
Figure 7:
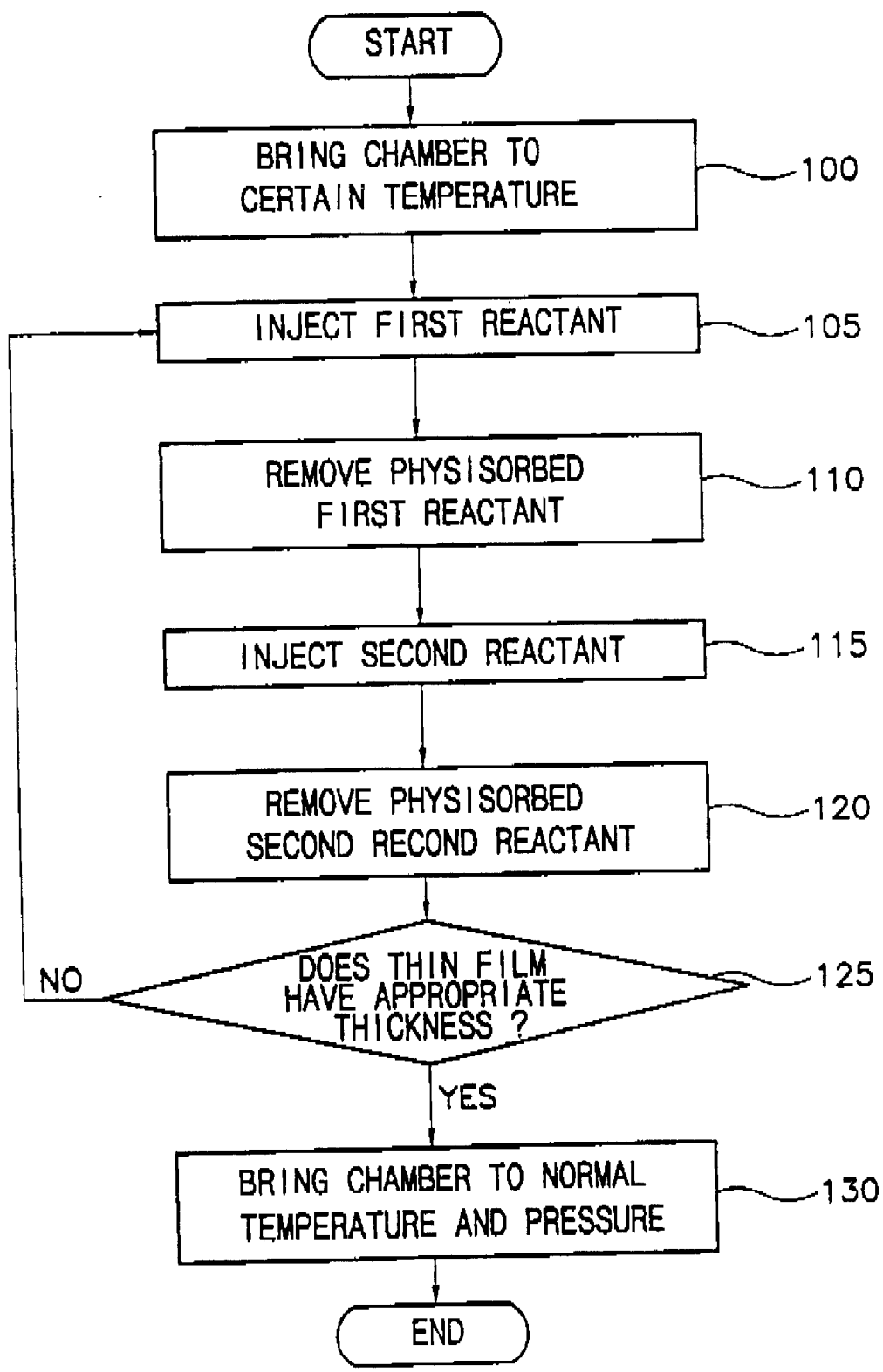
FIG. 7 is a flowchart describing the thin film manufacturing methods according to the present invention.

FIG. 6 is a schematic diagram of a thin film manufacturing apparatus used for the thin film manufacturing method according to the present invention. FIG. 7 is a flowchart describing the thin film manufacturing method according to the present invention. The embodiment described above will now be described with reference to FIGS. 6–10. After loading a substrate 1, for example a (100) silicon substrate, into a chamber 3, the chamber is brought to a pressure of about 2 Torr, and to a temperature of about 550° C. using a heater 5 (step 100). The first reactant stream containing TDMAS is injected into chamber 3 for 30 seconds while the substrate is maintained at 550° C. and about 2 Torr. (step 105). The TDMAS is vaporized to form a first reactant stream 6 by injecting 500 sccm of Ar carrier gas from a source 19 into the first bubbler 12, which contains liquid TDMAS at a temperature of about 25° C. The combined TDMAS and Ar gas stream is then injected into chamber 3 through a first gas line 13 and a shower head 15 for a period of about 30 seconds, as described above. Chamber 3 is then purged with pure Ar for 5 seconds, and then vacuum purged by pump 7 for 5 seconds. The invention is not intended to be limited to this particular purging scheme, and is intended to include alternate purging sequences that result in the removal of the physisorbed TDMAS from the chemisorbed surface layer of TDMAS.

The second reactant gas stream of activated NH3 in an Ar carrier is then injected into chamber 3 through gas line 16 and showerhead 15 for about 30 seconds at a rate of about 2000 sccm. During this step the substrate 1 is maintained at 550° C. and the chamber pressure is maintained at about 0.5 Torr (step 115 in FIG. 7). In one embodiment, the $NH_3$ in the second reactant gas stream is vaporized by bubbling Ar from gas source 19 through liquid $NH_3$ 14 held at about 25° C. in a second bubbler 17. The NH3 and Ar stream is then passed through a remote plasma generator (not shown), and then introduced into chamber 3 through gas line 16 and showerhead 15 for about 30 seconds at a rate of about 2000 sccm.

As represented in FIGS. 3 and 4, a portion of the NH3 in the second reactant stream reacts with the TDMAS chemisorbed on the substrate 1 to form a layer of $Si_3N_4$. As the layer of $Si_3N_4$ is formed on the substrate, a second portion of the NH3 in the second reactant stream is physisorbed onto the $Si_3N_4$ layer. The chamber 3 is then purged using an Ar stream for 5 seconds, followed by vacuum purging using pump 7 (step 120). However, the physisorbed second reactant can be also removed by vacuum pumping the chamber without first purging with an inert gas.

After purging the unreacted $NH_3$ from chamber 3, the $Si_3N_4$ film thickness is measured (step 125). If additional layer thickness is required, steps 105 through 125 are repeated until the desired film thickness is achieved. When the desired thickness has been reached, the manufacturing process is completed by returning the temperature and the pressure of the chamber to normal. (step 130).

Figure 8:
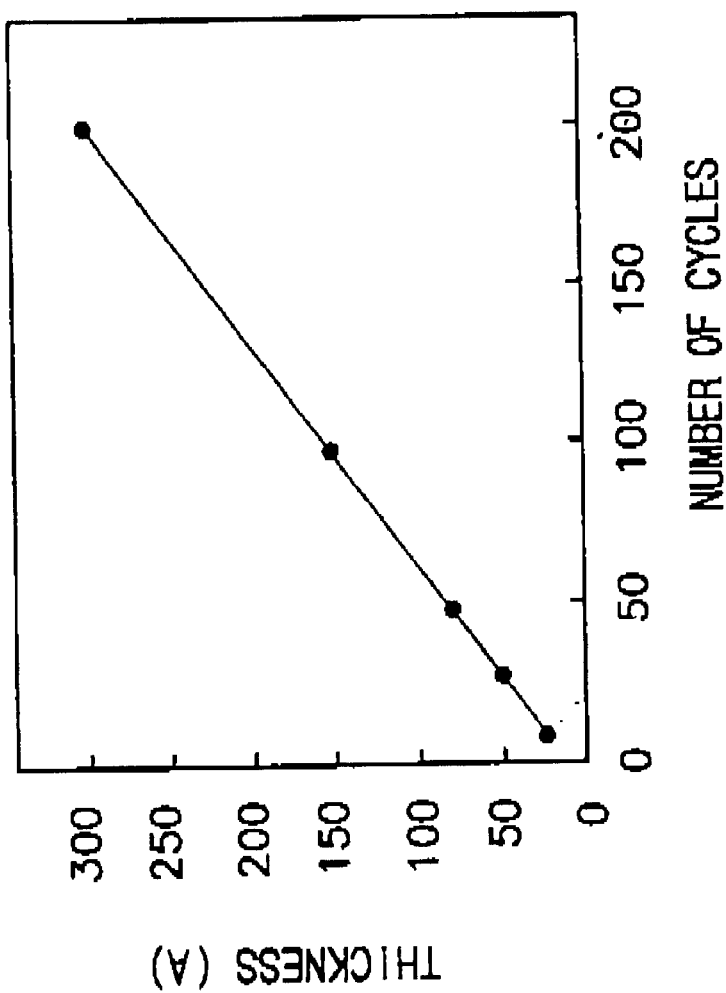
FIG. 8 is a graph showing the thickness of a $Si_3N_4$ film formed per cycle using a manufacturing method according to one preferred embodiment of the present invention.

As shown in FIG. 8, in the foregoing method for the formation of an $Si_3N_4$ layer, the deposition rate is 1.35 Å/cycle, and the film thickness demonstrates a linear relationship with respect to the number of cycles. The refractive index of the deposited material was measured at 2.0 at the wavelength of 632.8 nm, confirming that the deposited layer is stoichiometric Si3N4. The tensile stress of the film was measured at 5E10 dyne/cm2. The hydrogen content and the carbon content were both very low at about 1 at % or less, and no oxygen was detected. A step coverage of 95% or over was accomplished over a contact-type structure having an aspect ratio of 8:1. A wet etch rate with a 200:1 aqueous HF solution was relatively low at about 10 Å/min, providing the desired wet etch selectivity that is a useful feature of $Si_3N_4$ thin films.

Figure 9:
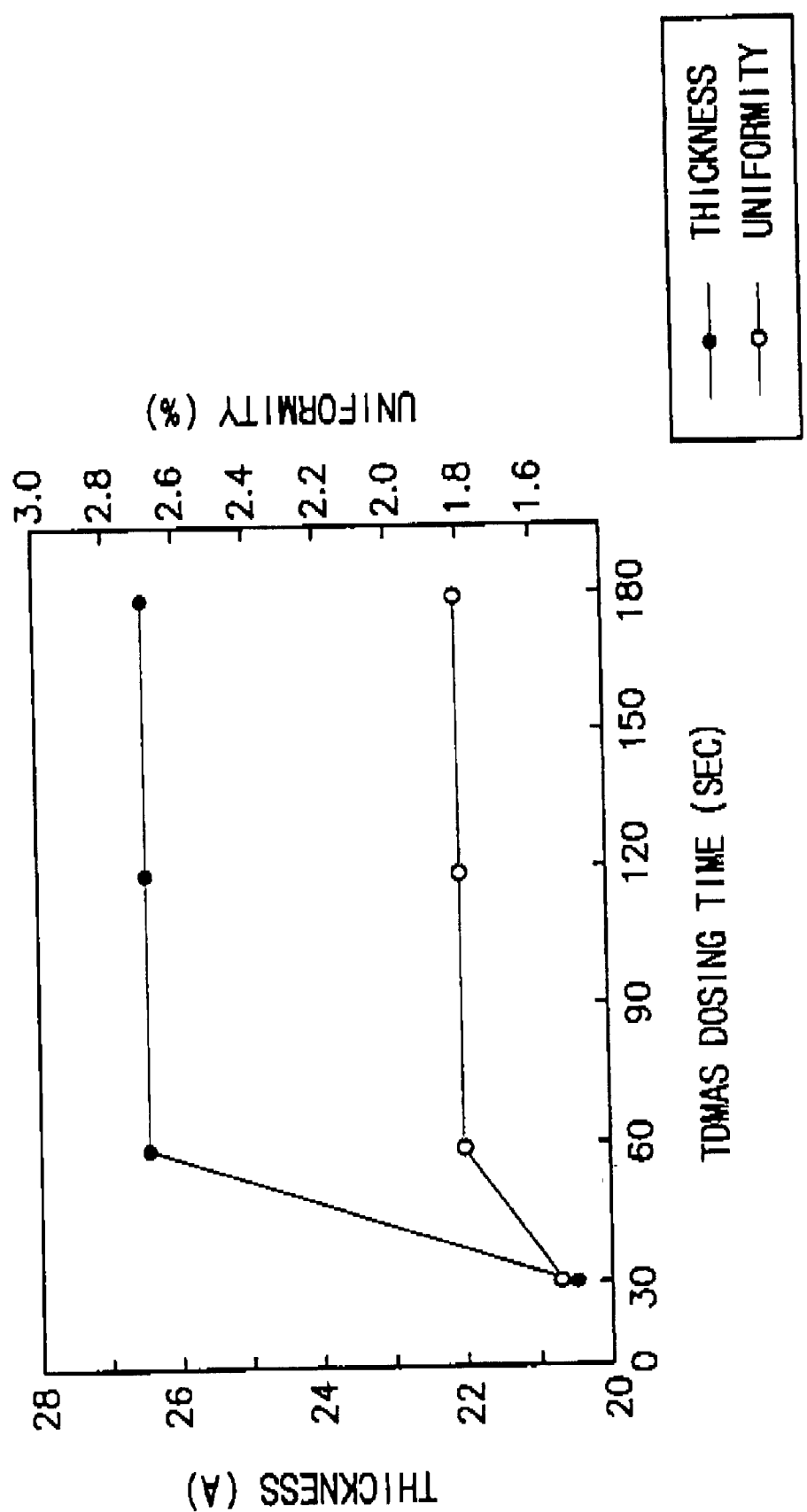
FIG. 9 is a graph showing the variation in $Si_3N_4$ film thickness and uniformity of a film as the TDMAS dosing time is varied in a method according to a preferred embodiment of the present invention.

Referring to FIG. 9, when considering the change of growth rate with respect to the amount of TDMAS exposure, which is a typical ALD deposition characteristic, it was confirmed that no change of the growth rate was detected from a total 60 second exposure time (flow for 15 seconds & hold for 45 seconds) under the above-described conditions. This would seem to indicate that an exposure time of 60 seconds results in a saturation of the substrate surface. In addition, when the TDMAS flowed for 30 seconds, the same growth rate was obtained as when the flowing time was 15 seconds and the holding time was 45 seconds or more.

Figure 10:
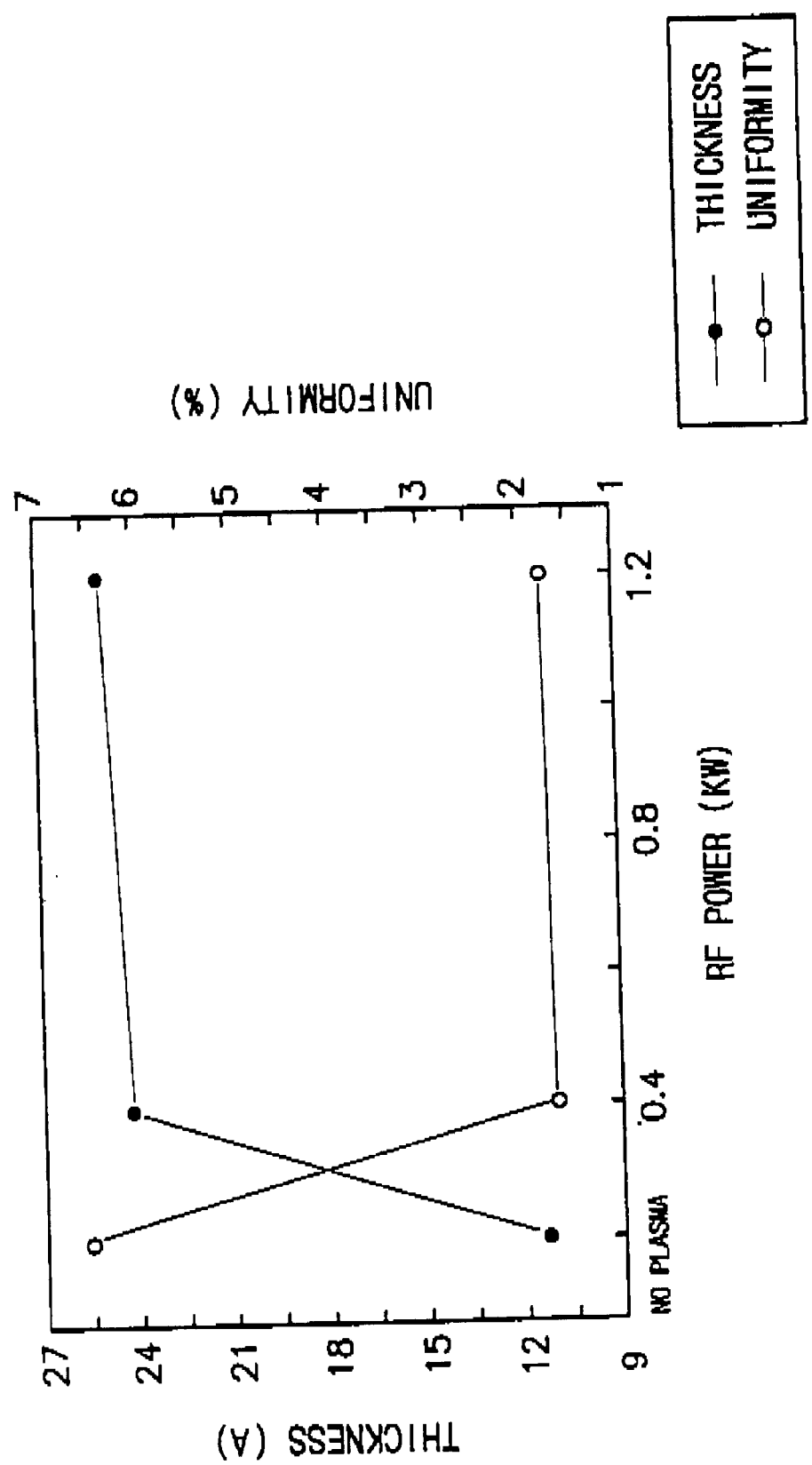
FIG. 10 is a graph showing the variation in $Si_3N_4$ film thickness and uniformity of a film as the $NH_3$ plasma generator power is varied in a method according to a preferred embodiment of the present invention.

Referring now to FIG. 10, the effect of the RF power level in the plasma generator was determined. Recall that in the method described above, after the substrate was exposed to TDMAS and the chamber purged, activated $NH_3$ was introduced into the chamber. As shown in FIG. 10, the use of activated $NH_3$ is an important aspect of the claimed methods. When the RF power in the power generator was 0, and therefore there was no activated NH3 introduced into the chamber, there was no $Si_3N_4$ film deposition at all, indicating no reaction between non-activated $NH_3$ and the TDMAS on the substrate. Between 0 and 0.4 kW, the deposition rate of the film increased in a linear relationship as shown. From 0.4 kW up, the growth rate increased little if at all, demonstrating a deposition rate relationship that is typical of ALD.

In other embodiments, the ALD process described above can be implemented by using TDMAS with $H_2O$, $H_2O_2$, activated $O_2$ (for example, $O_3$, $O_2$ remote plasma, etc.). In still other embodiment, the ALD process described above can be utilized for the formation of a silicate, which is a dielectric substance having a larger dielectric constant than that of $SiO_2$. In those embodiments, the process can be implemented by use of a metal oxide and TDMAS for forming a silicate layer.

The foregoing preferred embodiments are intended to be illustrative rather than limiting. Those of skill in the art will recognize that changes and modifications to the invention as described above are possible without departing from the scope of the following claims.

What is claimed is:

1. An atomic layer deposition method of forming a solid thin film layer containing silicon comprising the steps of:
   a) placing a substrate into a chamber;
   b) injecting a first reactant containing Si and an aminosilane into the chamber;
   c) chemisorbing a first portion of the first reactant onto the substrate and physisorbing a second portion of the first reactant onto the substrate;
   d) removing the physisorbed second portion of the first reactant from the substrate;
   e) injecting a second reactant into the chamber;
   f) chemically reacting a first portion of the second reactant with the chemisorbed first portion of the first reactant to form a silicon-containing solid on the substrate; and,
   g) removing the non-chemically reacted portion of the second reactant from the chamber.

2. A method as claimed in claim 1, wherein the silicon-containing solid formed on the substrate is a thin film layer.

3. A method as claimed in claim 1, wherein said first reactant is at least one selected from the group consisting of $Si[N(CH_3)_2]_4$, $SiH[N(CH_3)_2]_3$, $SiH_2[N(CH_3)_2]_2$ and $SiH_3[N(CH_3)_2]$.

4. A method as claimed in claim 2, wherein said thin film is a silicon nitride film.

5. A method as claimed in claim 4, wherein said second reactant is activated $NH_3$.

6. A method as claimed in claim 5, wherein said activated $NH_3$ is generated by a remote plasma generator.

7. A method as claimed in claim 1, wherein said second reactant is activated $NH_3$ and said activated $NH_3$ is generated by a catalytic method utilizing a noble metal.

8. A method as claimed in claim 1, wherein a component ratio of N/Si of said film is 1–1.6.

9. A method as claimed in claim 1, wherein a chamber pressure is in a range of 0.01–100 torr.

10. A method as claimed in claim 9, wherein a chamber pressure during implementing each step is the same.

11. A method as claimed in claim 9, wherein a chamber pressure during implementing at least one of said four steps is different from the remaining steps.

12. A method of forming a silicon-containing solid as in claim 1 wherein the silicon-containing solid formed on the substrate has a dry etch selectivity with respect to Si of a semiconductor device (active mask nitride).

13. A method of forming a silicon-containing solid as in claim 1 wherein the silicon-containing solid formed on the substrate has a dry etch selectivity with respect to WSix and doped poly-Si of a semiconductor device (gate mask nitride).

14. A method of forming a silicon-containing solid as in claim 1 wherein the silicon-containing solid formed on the substrate has a dry etch selectivity with respect to W and Ti/TiN of a semiconductor device (bit line mask nitride).

15. A method of forming a silicon-containing solid as in claim 1 wherein the silicon-containing solid formed on the substrate is a CMP stopper.

16. A method of forming a silicon-containing solid as in claim 1 wherein the silicon-containing solid formed on the substrate is an insulating layer having a dry etch selectivity with respect to $SiO_2$ of a semiconductor device (spacer).

17. A method of forming a silicon-containing solid as in claim 1 wherein the silicon-containing solid formed on the substrate is an insulating layer having an HF wet etch selectivity with respect to $SiO_2$ of a semiconductor device (wet stopper).

18. A method of forming a silicon-containing solid as in claim 1 wherein the silicon-containing solid formed on the substrate comprises a gate dielectric of a semiconductor device.

19. A method of forming a silicon-containing solid as in claim 1 wherein the silicon-containing solid formed on the substrate is a layer formed between a $Ta_2O_5$ layer and a capacitor storage node of a semiconductor device.

20. A method of forming a silicon-containing solid as in claim 1 wherein the silicon-containing solid formed on the substrate is a dielectric layer of a capacitor of a semiconductor device.

21. A method of forming a silicon-containing solid as in claim 1 wherein the silicon-containing solid formed on the substrate is an STI liner of a semiconductor device.

22. A method of forming a silicon-containing solid as in claim 1 wherein the silicon-containing solid formed on the substrate is silicon oxide.

23. A method as claimed in claim 22, wherein the second reactant is selected from the group consisting of $H_2O$, $H_2O_2$, $O_2$ plasma and $O_3$ plasma.

24. A method as claimed in claim 22, wherein a refractive index of thus formed thin film is in a range of 1.43–1.5.

25. A method of manufacturing a solid thin film containing silicon comprising the steps of:
   a) placing a substrate into a chamber;
   b) injecting a first gaseous reactant containing Si and H(CH3)2 into the chamber;
   c) reacting a first portion of the first reactant to form a first silicon-containing solid on the substrate and physisorbing a second portion of the first reactant onto the substrate;
   d) removing the physisorbed second portion of the first reactant from the substrate;
   e) injecting a second reactant into the chamber;
   f) chemically reacting a first portion of the second reactant to form a second silicon-containing solid on the substrate and physisorbing a second portion of the second reactant onto the substrate; and,
   g) removing the physisorbed second portion of the second reactant from the chamber.

26. A method as claimed in claim 25 wherein at least one of the first and second silicon-containing solids is a metal silicate.

27. A method as claimed in claim 26, wherein said silicate is a metal silicate of a metal selected from the group consisting of Al, Hf, Zr, Ti, and Ta.

28. An atomic layer deposition method of forming a solid thin film layer containing silicon comprising the steps of:
   a) placing a substrate into a chamber;
   b) injecting a first reactant containing Si and an aminosilane into the chamber;
   c) chemisorbing a first portion of the first reactant onto the substrate and physisorbing a second portion of the first reactant onto the substrate;
   d) removing the physisorbed second portion of the first reactant from the substrate;
   e) injecting a second reactant into the chamber;
   f) chemically reacting a first portion of the second reactant with the chemisorbed first portion of the first reactant to form a silicon-containing solid on the substrate;
   g) removing the unreacted portion of the second reactant from the chamber; and,
   h) repeating one or more of steps b)–g).

\* \* \* \* \*